(12) United States Patent
Meng et al.

(10) Patent No.: US 11,994,410 B2
(45) Date of Patent: May 28, 2024

(54) CALIBRATION AND VERIFICATION SYSTEM AND METHOD FOR DIRECTIONAL SENSOR

(71) Applicants: CHINA NATIONAL PETROLEUM CORPORATION, Beijing (CN); CHINA NATIONAL LOGGING CORPORATION, Xi'an (CN)

(72) Inventors: Zhuoran Meng, Beijing (CN); Jun Zhu, Beijing (CN); Fei Wang, Beijing (CN); Shuyun Cheng, Beijing (CN); Yao Wu, Beijing (CN); Sang Jia, Beijing (CN); Ying Guo, Beijing (CN); Hongsheng Cui, Beijing (CN); Yong Die, Beijing (CN); Ye Lu, Beijing (CN); Peng Chen, Beijing (CN); Tong Li, Beijing (CN); Jun Wang, Beijing (CN)

(73) Assignees: CHINA NATIONAL PETROLEUM CORPORATION, Beijing (CN); CHINA NATIONAL LOGGING CORPORATION, Xi'an (CN)

(*) Notice: Subject to any disclaimer, the term of this patent is extended or adjusted under 35 U.S.C. 154(b) by 191 days.

(21) Appl. No.: 17/622,370

(22) PCT Filed: Sep. 29, 2020

(86) PCT No.: PCT/CN2020/118738
§ 371 (c)(1),
(2) Date: Dec. 23, 2021

(87) PCT Pub. No.: WO2021/068797
PCT Pub. Date: Apr. 15, 2021

(65) Prior Publication Data
US 2022/0252440 A1 Aug. 11, 2022

(30) Foreign Application Priority Data

Oct. 8, 2019 (CN) .......................... 201921671017.4
Oct. 12, 2019 (CN) .......................... 201910969321.5

(51) Int. Cl.
*G01D 18/00* (2006.01)
*G01P 21/00* (2006.01)
*G01R 35/00* (2006.01)

(52) U.S. Cl.
CPC .............. *G01D 18/00* (2013.01); *G01P 21/00* (2013.01); *G01R 35/005* (2013.01)

(58) Field of Classification Search
CPC ..................................................... G01D 18/00
(Continued)

(56) References Cited

U.S. PATENT DOCUMENTS 9,250,100 B2   2/2016  Wu et al.
10,481,296 B2*  11/2019  Zacharko ............... G01V 13/00
(Continued)

FOREIGN PATENT DOCUMENTS

CN          101251584 B      9/2010
CN          202031580 U      11/2011
(Continued)

OTHER PUBLICATIONS

First Office Action and Search report issued on Jun. 17, 2022, for counterpart Russia patent application No. 2021135953, along with the English translation.
(Continued)

*Primary Examiner* — Vincent Q Nguyen
(74) *Attorney, Agent, or Firm* — The Dobrusin Law Firm, P.C.; Daniela M. Thompson-Walters

(57) ABSTRACT

A calibration and verification system for a directional sensor, including an industrial control computer and a directional
(Continued)

sensor, wherein the industrial control computer is connected to a sensor signal acquisition system, a first triaxial Helmholtz coil and a second triaxial Helmholtz coil, respectively, wherein a heating calibration turntable is disposed in the first triaxial Helmholtz coil and configured to heat and calibrate the directional sensor, and wherein a high-precision inclination and azimuth test turntable is disposed in the second triaxial Helmholtz coil and configured to verify the directional sensor.

15 Claims, 13 Drawing Sheets

(58) Field of Classification Search
USPC ............ 324/202, 333, 338, 346, 654, 76.75
See application file for complete search history.

(56) References Cited

U.S. PATENT DOCUMENTS

| | | |
|---|---|---|
| 2015/0145625 A1 | 5/2015 | Fukasawa et al. |
| 2015/0168176 A1 | 6/2015 | Wu et al. |
| 2016/0041234 A1* | 2/2016 | Li .......................... G01V 3/081 324/202 |

FOREIGN PATENT DOCUMENTS

| | | |
|---|---|---|
| CN | 102853760 A | 1/2013 |
| CN | 103089242 A | 5/2013 |
| CN | 105698792 A | 6/2016 |
| CN | 205532591 U | 8/2016 |
| CN | 108267157 A | 7/2018 |
| CN | 108508390 A | 9/2018 |
| CN | 109298365 A | 2/2019 |
| CN | 109407159 A | 3/2019 |
| CN | 110043251 A | 7/2019 |
| CN | 110849403 A | 2/2020 |
| CN | 211201936 U | 8/2020 |
| RU | 124790 U1 | 2/2013 |
| RU | 2525564 C2 | 8/2014 |
| RU | 2577806 C1 | 3/2016 |
| RU | 2610957 C1 | 2/2017 |

OTHER PUBLICATIONS

International Search Report, Application No. PCT/CN2020/118738 mailed Dec. 29, 2020.

Chinese Office Action and Chinese Search Report. Application No. 201910969321.5, dated Feb. 1, 2021.

R.Estes, et al., Improvement of Azimuth Accuracy by Use of Iterative Total Field Calibration Technique and Compensation for System Environment Effects.

* cited by examiner

CALIBRATION AND VERIFICATION SYSTEM AND METHOD FOR DIRECTIONAL SENSOR

CROSS-REFERENCE TO RELATED APPLICATIONS

This application claims priorities of Chinese application No. 201910969321.5 entitled as 'Calibration method of directional sensor' and filed on Oct. 12, 2019, and Chinese application No. 201921671017.4 entitled as 'Calibration and verification system of directional sensor' and filed on Oct. 8, 2019, the entire contents of which are incorporated herein by reference.

TECHNICAL FIELD

The present disclosure relates to a technical field of calibration and verification of downhole directional sensors in the petroleum industry, and particularly to a calibration and verification system and method for a directional sensor.

BACKGROUND

This section is intended to provide a background or context for the embodiments of the present disclosure set forth in the claims. The description here should not be recognized as the prior art although it is included in this section.

In the industry of petroleum drilling and logging, a directional sensor based on the structure of the magnetic and acceleration sensors is usually adopted to measure an attitude of a downhole device, and its measurement accuracy affects a precision of a borehole trajectory. In order to ensure a measurement precision, it is necessary to trace and calibrate each sensor of the directional sensors.

At present, in the petroleum industry, the directional sensor based on the structure of the magnetic and acceleration sensors usually adopts a method of total field calibration. By changing a spatial attitude of the directional sensor, the method separately calibrates the magnetic sensor and the acceleration sensor using a standard geomagnetic field and a gravity field respectively. The method employs an environmental magnetic field for tracing, and has strict requirements on the magnetic field environment. Moreover, because the environmental magnetic field and the earth gravity field are not in a same direction, the calibration procedure needs to collect data of a plurality of spatial attitudes repeatedly.

In addition, a calibration device using the method of 'total field calibration' does not accurately identify an inclination, an azimuth or a tool surface, and the calibrated directional sensor often adopts a method of rotation test on the calibration device to prove the measurement precision of the calibration result. Such method lacks a verification of the above key measurement data.

SUMMARY

The embodiments of the present disclosure provide a calibration and verification system for a directional sensor to overcome the defect that a magnetic sensor and an acceleration sensor need to be calibrated separately in a calibration procedure of the directional sensor. The system comprises:

a first triaxial Helmholtz coil 1, a heating calibration turntable 3, an industrial control computer 11, a sensor signal acquisition system 12 and a directional sensor 15;

wherein the industrial control computer 11 is connected to the first triaxial Helmholtz coil 1 and the sensor signal acquisition system 12 respectively, the sensor signal acquisition system 12 is connected to the heating calibration turntable 3 placed in the first triaxial Helmholtz coil 1, and the directional sensor 15 is placed on the heating calibration turntable 3;

the first triaxial Helmholtz coil 1 is configured to generate an additional magnetic field after offsetting a static environmental magnetic field by adjustment under a control of the industrial control computer 11, a magnitude of a magnetic induction intensity of the additional magnetic field being equal to that of a geomagnetic induction intensity, and a direction of the magnetic induction intensity being the same as that of a gravity field;

the heating calibration turntable 3 is configured to adjust a temperature and triaxial angles under the additional magnetic field, and generate first acquisition data of the directional sensor 15 at different attitudes;

the sensor signal acquisition system 12 is configured to acquire the first acquisition data and calibrate the directional sensor 15 according to the first acquisition data under the control of the industrial control computer 11.

The embodiments of the present disclosure provide a calibration and verification method for a directional sensor to overcome the defect that a magnetic sensor and an acceleration sensor need to be calibrated separately in a calibration procedure of the directional sensor. The method comprises:

controlling, by an industrial control computer 11, a first triaxial Helmholtz coil ito generate an additional magnetic field after offsetting a static environmental magnetic field, a magnitude of a magnetic induction intensity of the additional magnetic field being equal to that of a geomagnetic induction intensity, and a direction of the magnetic induction intensity being the same as that of a gravity field;

adjusting a temperature and triaxial angles of a heating calibration turntable 3 under the additional magnetic field, and generating first acquisition data of a directional sensor 15 at different attitudes;

controlling, by the industrial control computer 11, a sensor signal acquisition system 12 to acquire the first acquisition data and calibrate the directional sensor 15 according to the first acquisition data;

wherein the directional sensor 15 is placed on the heating calibration turntable 3, and the heating calibration turntable 3 is placed in the first triaxial Helmholtz coil 1.

The embodiments of the present disclosure further provide a computer device, comprising a memory, a processor, and a computer program stored in the memory and executable on the processor, wherein the processor implements the above calibration and verification method for a directional sensor when executing the computer program.

The embodiments of the present disclosure further provide a computer readable storage medium, which stores a computer program for performing the above calibration and verification method for a directional sensor.

In the embodiments of the present disclosure, a directional sensor is installed on a heating calibration turntable;

a first triaxial Helmholtz coil is adjusted to generate an additional magnetic field after offsetting a static environmental magnetic field, the magnitude of a magnetic induction intensity of the additional magnetic field being equal to that of a geomagnetic induction intensity, and the direction of the magnetic induction intensity being the same as that of a gravity field; a temperature and triaxial angles of the heating calibration turntable are adjusted to generate first acquisition data of the directional sensor. The calibration for the directional sensor solves the problem that the data of the magnetic sensor and the acceleration sensor needs to be acquired repeatedly in the calibration procedure because the environmental magnetic field and the earth gravity field are in different directions. Thus, the calibration procedure is simplified and the calibration efficiency for the directional sensor is improved.

BRIEF DESCRIPTION OF DRAWINGS

To explain the technical solutions of the embodiments in this disclosure or the prior art more clearly, a brief introduction will be made to the drawings for the embodiments or the prior art. It is to be understood that the drawings described below involve only some embodiments described in this disclosure, and those skilled in the art may arrive at drawings for other embodiments from this disclosure without creative efforts.

The reference signs are as follows: 1—first triaxial Helmholtz coil; 2—second triaxial Helmholtz coil; 3—heating calibration turntable; 4—high-precision inclination and azimuth test turntable; 5—first base; 6—second base; 7—first triaxial Helmholtz coil power supply; 8—second triaxial Helmholtz coil power supply; 9—triaxial Helmholtz coil power supply controller; 10—triaxial Helmholtz coil switching controller; 11—industrial control computer; 12—sensor signal acquisition system; 13—display; 14—heating calibration turntable temperature controller; 15—directional sensor; 1501—magnetic sensor; 1502—acceleration sensor; 16—level meter; 17—triaxial magnetic sensor.

DESCRIPTION OF EMBODIMENTS

In order that the objectives, technical solutions and advantages of the embodiments of the present disclosure are clearer, the embodiments of the present disclosure will be further described in detail below with reference to the drawings. Here, the illustrative embodiments of the present disclosure and the descriptions thereof are used to explain the present disclosure, but not as a limitation to the present disclosure.

Figure 1:
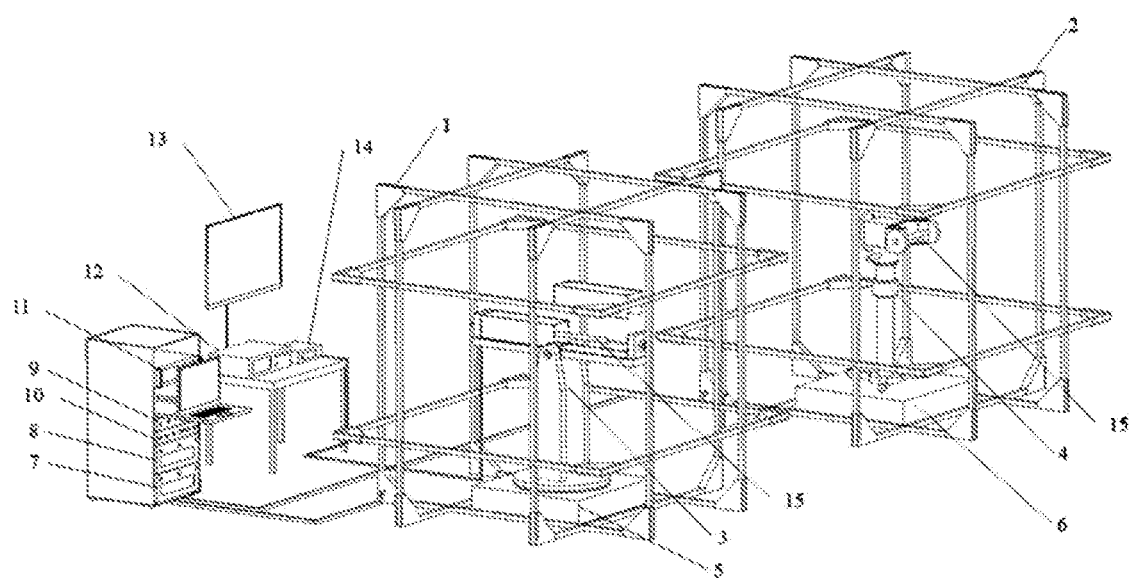
FIG. 1 is a schematic diagram of a calibration and verification system for a directional sensor according to an embodiment of this disclosure.

FIG. 1 is a schematic diagram of a calibration and verification system for a directional sensor according to an embodiment of this disclosure. As illustrated in FIG. 1, when a directional sensor is calibrated, the system comprises a first triaxial Helmholtz coil 1, a heating calibration turntable 3, an industrial control computer 11, a sensor signal acquisition system 12 and a directional sensor 15;

wherein the industrial control computer 11 is connected to the first triaxial Helmholtz coil 1 and the sensor signal acquisition system 12 respectively, the sensor signal acquisition system 12 is connected to the heating calibration turntable 3 placed in the first triaxial Helmholtz coil 1, and the directional sensor 15 is placed on the heating calibration turntable 3;

the first triaxial Helmholtz coil 1 is configured to generate an additional magnetic field after offsetting a static environmental magnetic field by adjustment under a control of the industrial control computer 11, a magnitude of a magnetic induction intensity of the additional magnetic field being equal to that of a geomagnetic induction intensity, and a direction of the magnetic induction intensity being the same as that of a gravity field;

the heating calibration turntable 3 is configured to adjust a temperature and triaxial angles under the additional magnetic field, and generate first acquisition data of the directional sensor 15 at different attitudes;

the sensor signal acquisition system 12 is configured to acquire the first acquisition data and calibrate the directional sensor 15 according to the first acquisition data under the control of the industrial control computer 11;

wherein the heating calibration turntable 3 is a Model 1503-TS-SPL calibration turntable of IDEAL AEROSMITH company.

Figure 10:
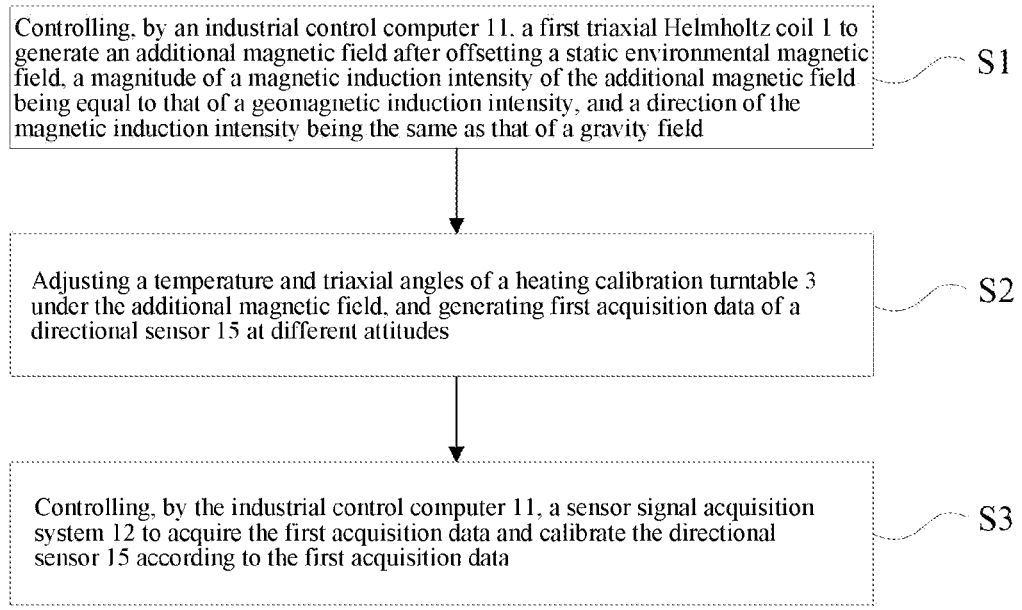
FIG. 10 is a schematic flowchart of a calibration method for a directional sensor according to an embodiment of this disclosure.

Based on the same inventions-creation, an embodiment of the present disclosure further provides a calibration and verification method for a directional sensor, as illustrated in FIG. 10, comprising:
- S1: controlling, by an industrial control computer 11, a first triaxial Helmholtz coil 1 to generate an additional magnetic field after offsetting a static environmental magnetic field, a magnitude of a magnetic induction intensity of the additional magnetic field being equal to that of a geomagnetic induction intensity, and a direction of the magnetic induction intensity being the same as that of a gravity field;
- S2: adjusting a temperature and triaxial angles of a heating calibration turntable 3 under the additional magnetic field, and generating first acquisition data of a directional sensor 15 at different attitudes;
- S3: controlling, by the industrial control computer 11, a sensor signal acquisition system 12 to acquire the first acquisition data and calibrate the directional sensor 15 according to the first acquisition data;
- wherein the directional sensor 15 is placed on the heating calibration turntable 3, and the heating calibration turntable 3 is placed in the first triaxial Helmholtz coil 1.

Figure 4:
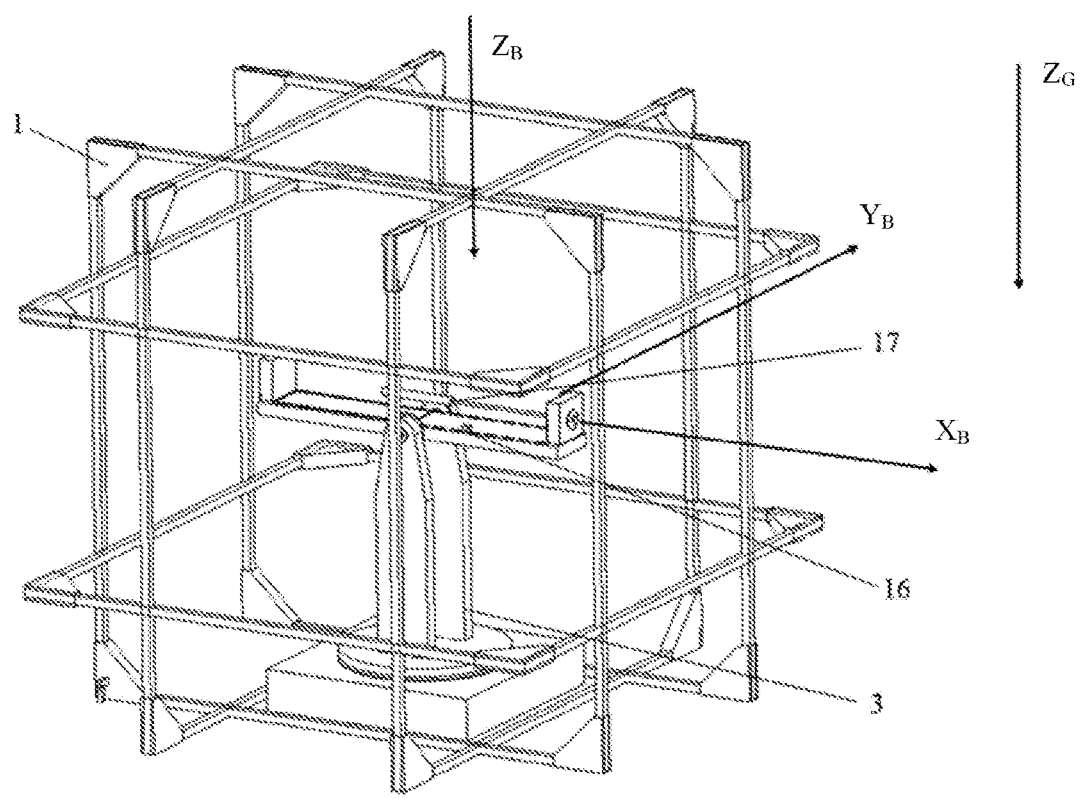
FIG. 4 is a schematic diagram of a calibration of a triaxial Helmholtz coil according to an embodiment of this disclosure.

In the embodiment of the present disclosure, as illustrated in FIG. 4, a level meter 16 placed on the heating calibration turntable 3 is also provided for calibrating a horizontal attitude of the heating calibration turntable 3.

In the embodiment of the present disclosure, as illustrated in FIG. 4, a triaxial magnetic sensor 17 placed on the heating calibration turntable 3 is also provided for calibrating a calibration coefficient, a zero deviation and an orthogonality of the first triaxial Helmholtz coil 1. The triaxial magnetic sensor 17 is mag-03 or mag-13 of Bartington company.

Therefore, before step S1 or S2, the method further comprises the following steps:
(1) tracing a triaxial magnetic sensor in a standard magnetic source, which ensures a measurement precision and accuracy of the triaxial magnetic sensor 17 itself and a validity of magnetic measurement data transmitted to the triaxial Helmholtz coil and the directional sensor;
(2) calibrating an azimuth of the heating calibration turntable 3.

Figure 12:
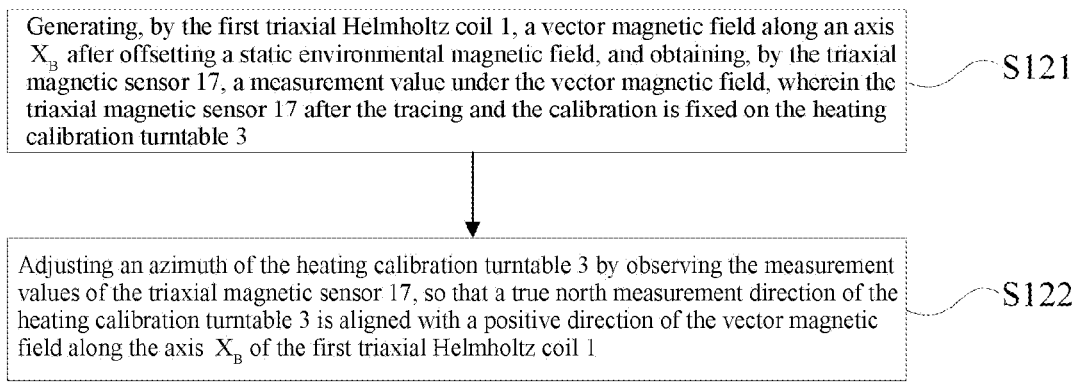
FIG. 12 is a schematic flowchart of correcting an azimuth of a heating calibration turntable according to an embodiment of this disclosure.

Referring to FIG. 4, which is a schematic diagram of calibrating a triaxial Helmholtz coil, and an azimuth calibration method is illustrated in FIG. 12, comprising:
- S121: generating, by the first triaxial Helmholtz coil 1, a vector magnetic field along an axis $X_B$ after offsetting a static environmental magnetic field, and obtaining, by the triaxial magnetic sensor 17, a measurement value under the vector magnetic field, wherein the triaxial magnetic sensor 17 after the tracing and the calibration is fixed on the heating calibration turntable 3;
- S122: adjusting an azimuth of the heating calibration turntable 3 by observing the measurement values of the triaxial magnetic sensor 17, so that a true north measurement direction of the heating calibration turntable 3 is aligned with a positive direction of the vector magnetic field along the axis $X_B$ of the first triaxial Helmholtz coil 1.

(3) Calibrating a magnetic field of the triaxial Helmholtz coil using the triaxial magnetic sensor.

Figure 5:
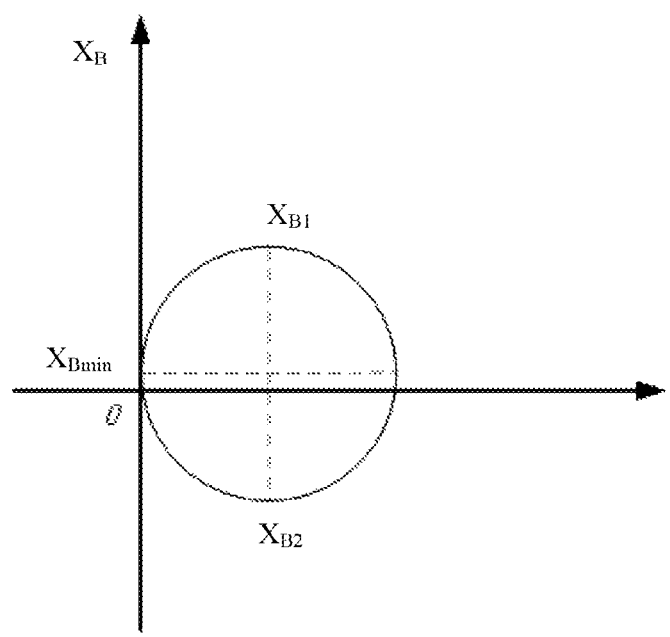
FIG. 5 is a principle schematic diagram of correcting a zero deviation and a calibration coefficient of an axis XB of a triaxial Helmholtz coil according to an embodiment of this disclosure.
Figure 13:
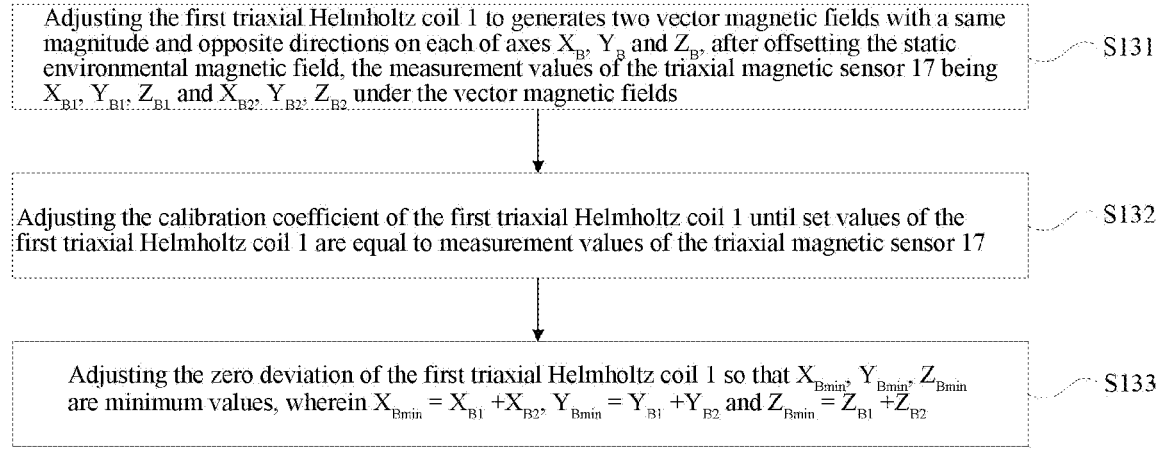
FIG. 13 is a schematic flowchart of correcting a zero deviation and a calibration coefficient of an axis XB of a triaxial Helmholtz coil according to an embodiment of this disclosure.

Referring to FIG. 5, which is a principle schematic diagram of correcting a zero deviation and a calibration coefficient of the axis $X_B$ of the triaxial Helmholtz coil. The specific procedure of calibrating the calibration coefficient and the zero deviation of the first triaxial Helmholtz coil 1 is illustrated in FIG. 13, comprising:
- S131: adjusting the first triaxial Helmholtz coil 1 to generates two vector magnetic fields with a same magnitude and opposite directions on each of axes $X_B$, $Y_B$ and $Z_B$ after offsetting the static environmental magnetic field, the measurement values of the triaxial magnetic sensor 17 being $X_{B1}$, $Y_{B1}$, $Z_{B1}$ and $X_{B2}$, $Y_{B2}$, $Z_{B2}$ under the vector magnetic fields;
- S132: adjusting the calibration coefficient of the first triaxial Helmholtz coil 1 until set values of the first triaxial Helmholtz coil 1 are equal to measurement values of the triaxial magnetic sensor 17, wherein the set value of the first triaxial Helmholtz coil 1 refers to the magnitude of a magnetic field generated by the triaxial Helmholtz coil, and the calibration coefficient refers to a gain;
- S133: adjusting the zero deviation of the first triaxial Helmholtz coil 1 so that $X_{Bmin}$, $Y_{Bmin}$, $Z_{Bmin}$ are minimum values, wherein $X_{Bmin}=X_{B1}+X_{B2}$, $Y_{Bmin}=Y_{B1}+Y_{B2}$ and $Z_{Bmin}=Z_{B1}+Z_{B2}$, and $X_{Bmin}$, $Y_{Bmin}$, $Z_{Bmin}$ are calculated zero deviations of the first triaxial Helmholtz coil 1.

Figure 6:
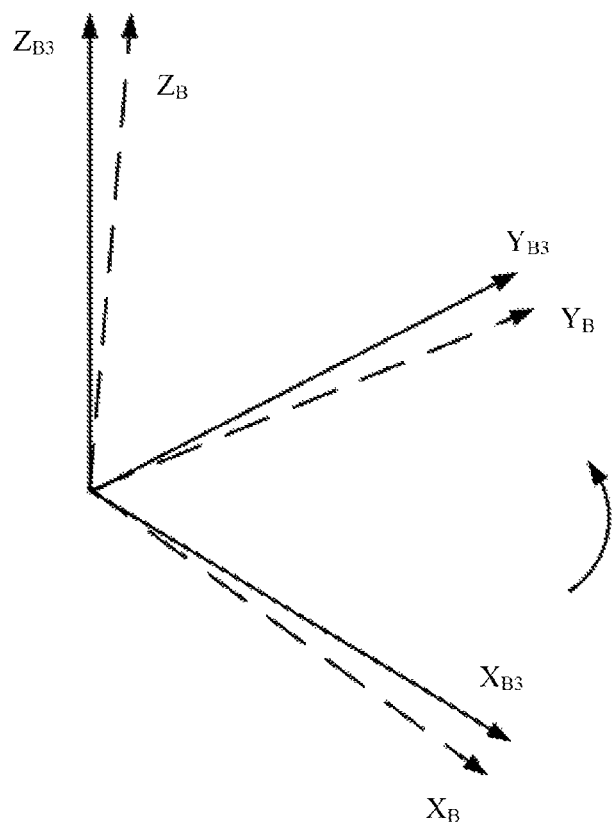
FIG. 6 is a principle schematic diagram of correcting an orthogonal deviation of a triaxial Helmholtz coil according to an embodiment of this disclosure.
Figure 14:
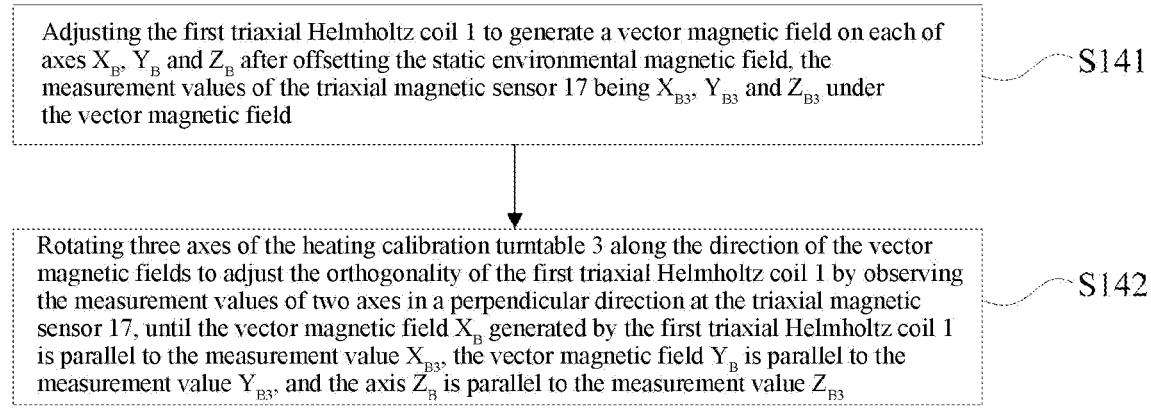
FIG. 14 is a schematic flowchart of correcting an orthogonal deviation of a triaxial Helmholtz coil according to an embodiment of this disclosure.

In the embodiment of the present disclosure, referring to FIG. 6, which is a principle schematic diagram of correcting an orthogonal deviation of a triaxial Helmholtz coil. The specific procedure of calibrating the orthogonality of the first triaxial Helmholtz coil 1 is illustrated in FIG. 14, comprising:
- S141: adjusting the first triaxial Helmholtz coil 1 to generate a vector magnetic field on each of axes $X_B$, $Y_B$ and $Z_B$ after offsetting the static environmental magnetic field, the measurement values of the triaxial magnetic sensor 17 being $X_{B3}$, $Y_{B3}$ and $Z_{B3}$ under the vector magnetic field;
- S142: rotating three axes of the heating calibration turntable 3 along the direction of the vector magnetic fields to adjust the orthogonality of the first triaxial Helmholtz coil 1 by observing the measurement values of two axes in a perpendicular direction at the triaxial magnetic sensor 17 until the vector magnetic field $X_B$ generated by the first triaxial Helmholtz coil 1 is parallel to the measurement value $X_{B3}$, the vector magnetic field $Y_B$ is parallel to the measurement value $Y_{B3}$, and an axis $Z_B$ is parallel to the measurement value $Z_{B3}$, while $X_B$, $Y_B$ and $Z_B$ are perpendicular to each other.

The calibration for the directional sensor using the triaxial Helmholtz coil will be descried in detail below.

Figure 7:
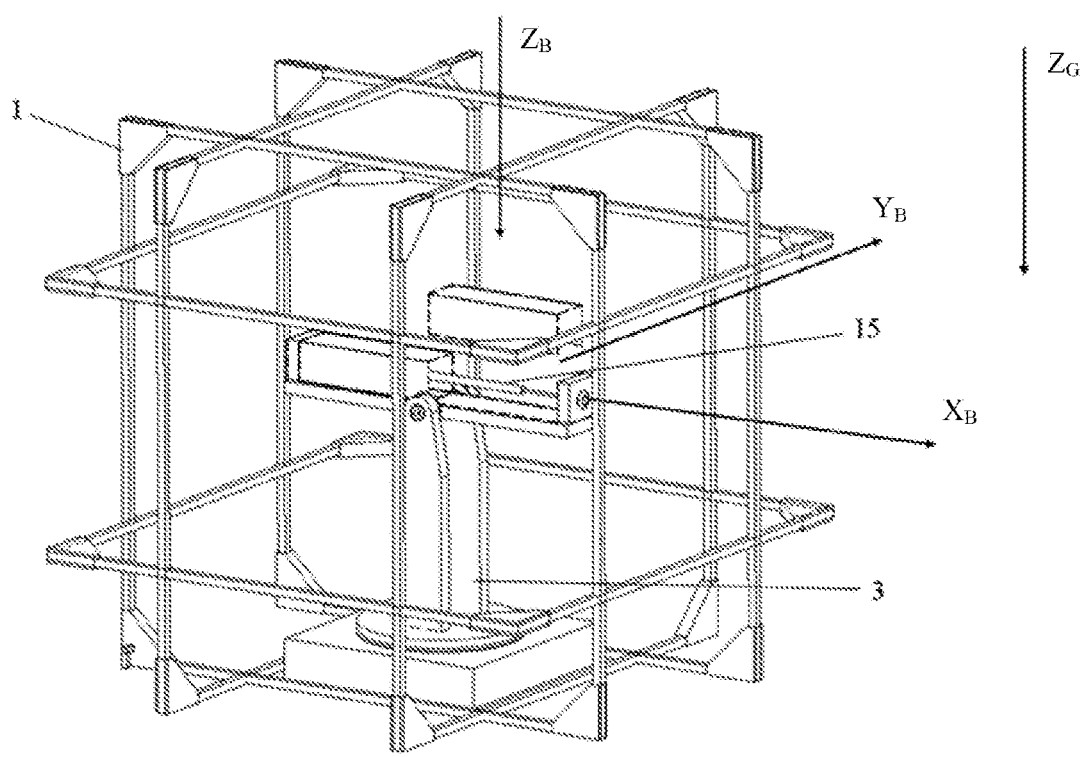
FIG. 7 is a structural schematic diagram of a directional sensor installed on a heating calibration turntable according to an embodiment of this disclosure.

In the embodiment of the present disclosure, referring to FIG. 7, which is a structural schematic diagram of a directional sensor installed on a heating calibration turntable. The directional sensor 15 to be calibrated is installed on the heating calibration turntable 3. The axis $Z_B$ of the first triaxial Helmholtz coil 1 is adjusted after offsetting the static environmental magnetic field to generate an additional magnetic field. The generated magnetic field vector has the magnitude equal to that of a geomagnetic field, and the direction parallel to that of a gravity field $Z_G$.

Figure 8:
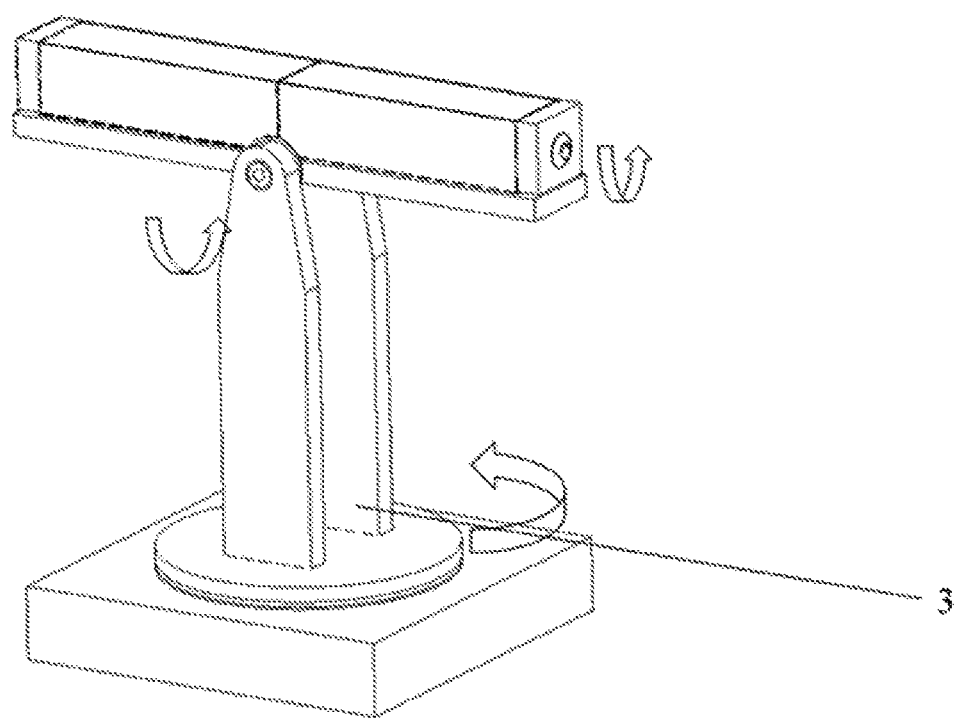
FIG. 8 is a structural schematic diagram of a heating calibration turntable according to an embodiment of this disclosure.

In the embodiment of the present disclosure, referring to FIG. 8, which is a structural schematic diagram of a heating calibration turntable, in which all three axes are rotatable for angle adjustment. By adjusting the temperature in the heating calibration turntable 3, the three axes of the heating calibration turntable 3 are rotated under different temperatures to calibrate the directional sensor.

In the embodiment of the present disclosure, the data processing method adopts a total field calibration method for data processing. The total field calibration method proposed in the article 'Improvement of Azimuth Accuracy by Use of Iterative Total Field Calibration Technique and Compensation for System Environment' published by R Estes and P Walters at the SPE conference in 1989 is the most advanced calibration method for the directional sensor at present. Therefore, the sensor signal acquisition system 12 is specifically configured to calibrate the directional sensor 15 using the total field calibration method. Because the directional sensor 15 comprises a magnetic sensor 1501 and an acceleration sensor 1502, as illustrated in FIG. 9, the first acquisition data is the data of the acceleration sensor and the magnetic sensor (including the inclination, the azimuth, the tool surface, etc.), and the calibration for the directional sensor 15 is simultaneously calibrating the magnetic sensor and the acceleration sensor.

Figure 11:
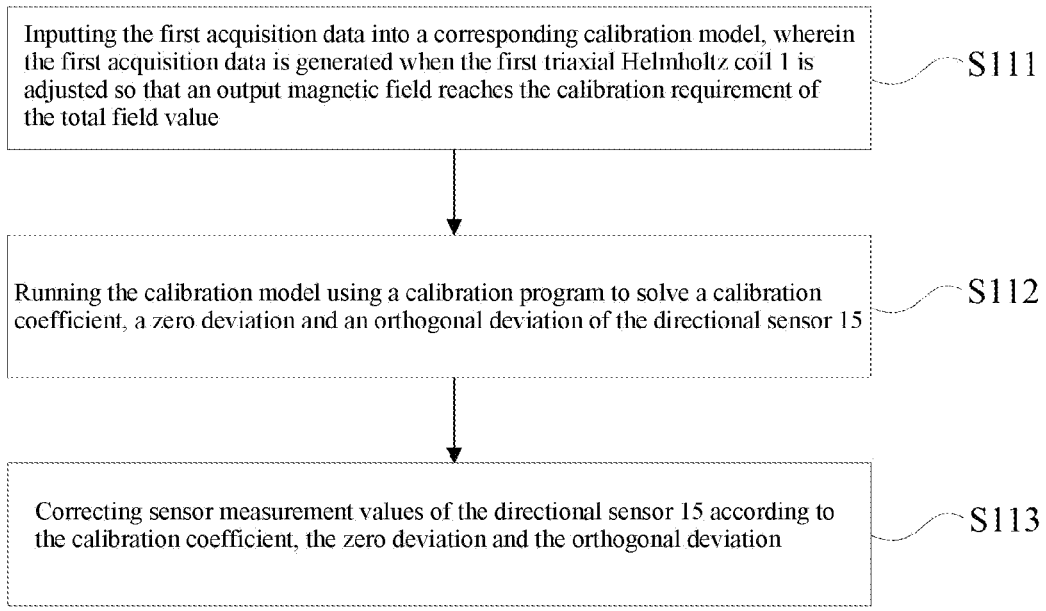
FIG. 11 is a schematic flowchart of a specific calibration method for a directional sensor according to an embodiment of this disclosure.

As illustrated in FIG. 11, the directional sensor 15 is calibrated according to the first acquisition data as follows:
S111: inputting the first acquisition data into a corresponding calibration model, wherein the first acquisition data is generated when the first triaxial Helmholtz coil 1 is adjusted so that an output magnetic field meets a calibration requirement of a total field value;
S112: running the calibration model using a calibration program to solve a calibration coefficient, a zero deviation and an orthogonal deviation of the directional sensor 15;
S113: correcting sensor measurement values of the directional sensor 15 according to the calibration coefficient, the zero deviation and the orthogonal deviation.

Figure 9:
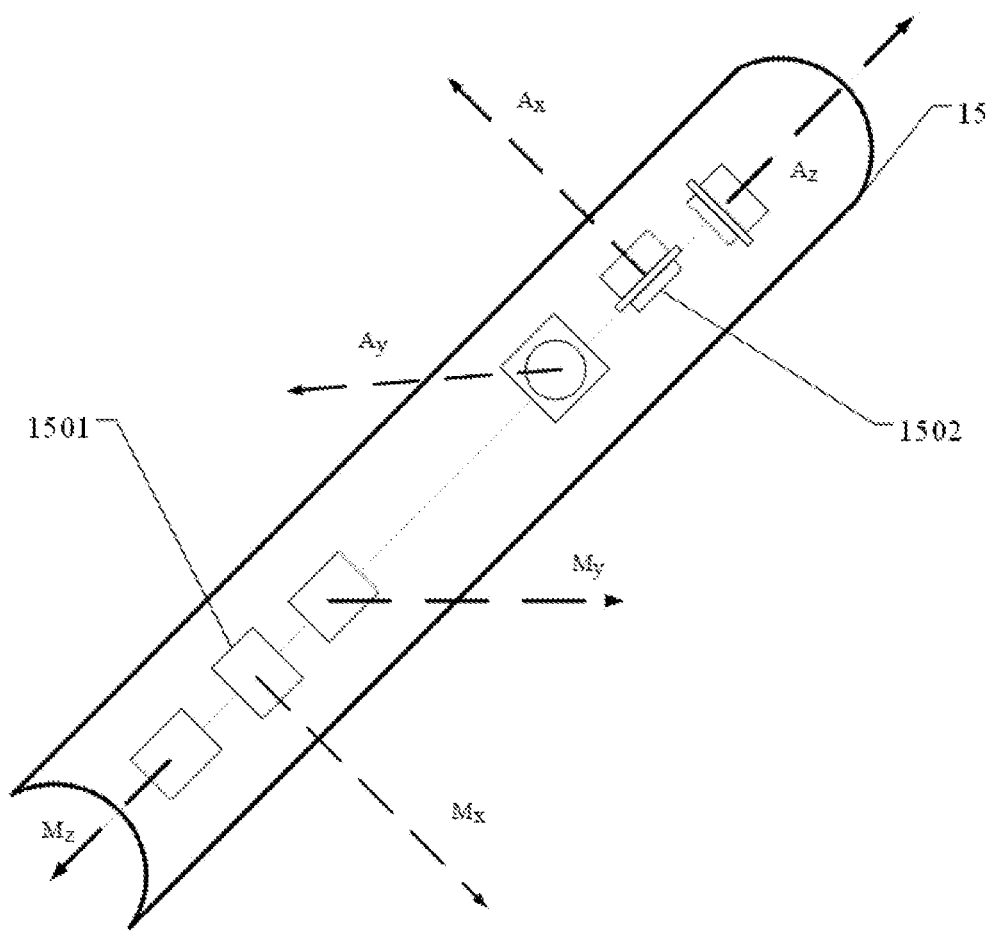
FIG. 9 is a structural schematic diagram of a directional sensor according to an embodiment of this disclosure.

Referring to FIG. 9, taking the calibration for the magnetic sensor as an example, the calibration model is selected as follows:

$$\begin{bmatrix} M_x \\ M_y \\ M_z \end{bmatrix} = \begin{bmatrix} m_{xx} & m_{xy} & m_{xz} \\ m_{yx} & m_{yy} & m_{yz} \\ m_{zx} & m_{zy} & m_{zz} \end{bmatrix} \left\{ \begin{bmatrix} V_x \\ V_y \\ V_z \end{bmatrix} - \begin{bmatrix} V_{ox} \\ V_{oy} \\ V_{oz} \end{bmatrix} \right\} \quad (1)$$

wherein $M_x$, $M_y$ and $M_z$ are triaxial vectors of the magnetic sensors, $V_x$, $V_y$ and $V_z$ are original voltage data acquired by the magnetic sensor, $m_{xx}$, $m_{yy}$, and $m_{zz}$ are triaxial calibration coefficients of the magnetic sensors, $m_{xy}$, $m_{xz}$, $m_{yx}$, $m_{yz}$, $m_{zx}$ and $m_{zy}$ are orthogonal deviations, and $V_{ox}$, $V_{oy}$ and $V_{oz}$ are triaxial zero deviations of the magnetic sensor.

The calibration procedure is a procedure for solving the calibration coefficient, the zero deviation and the orthogonal deviation of the sensor. Through the calibrations at different temperature points, the calibration coefficient and the zero deviation may be a solution set of a function of relative temperature changes.

A plurality of sensor acquisition data of $M_x$, $M_y$ and $M_z$ is obtained through the triaxial rotation of the heating calibration turntable 3. During the measurement of the sensor, the method of 'total field calibration' obtains a total field value by means of other devices, and the total field value is a vector sum of the three axes of the magnetic sensor. For example, the total field value TMF is:

$$TMF = \sqrt{M_x^2 + M_y^2 + M_z^2} \quad (2)$$

By adjusting the generated magnetic field intensity of the first triaxial Helmholtz coil 1, the total field value TMF meets the calibration requirement; and by adjusting the axis $Z_B$ of the first triaxial Helmholtz coil 1 to be 50 μT, the TMF is 50 μT, so as to simulate a local geomagnetic field intensity.

In solving formula (1), 12 calibration values of the magnetic sensor at the same temperature are constants.

By employing a total field intensity constraint of the magnetic sensor in a plurality of directions and iterative calculations, the directional sensor 15 can be calibrated without an accurate calibrating jig.

12 calibration values may be obtained from measurement values $A_x$, $A_y$ and $A_z$ of three acceleration sensors in a same method.

According to the present disclosure, the magnetic field direction of the first triaxial Helmholtz coil 1 is adjusted so that the magnetic field and the gravity field are in the same direction, and when the heating calibration turntable 3 is rotated, the magnetic sensor and the acceleration sensor of the directional sensor 15 can be simultaneously calibrated at a same position.

In the embodiment of the present disclosure, as illustrated in FIG. 1, the system may further comprise a first base 5 disposed in the first triaxial Helmholtz coil 1, and the heating calibration turntable 3 is disposed on the first base 5.

In the embodiment of the present disclosure, as illustrated in FIG. 1, the system further comprises a heating calibration turntable temperature controller 14, which is connected to the industrial control computer 11 and the heating calibration turntable 3 respectively, and configured to control a temperature adjustment of the heating calibration turntable 3 under the control of the industrial control computer 11, raise the temperature of the heating calibration turntable 3 to different temperature points, and repeat the calibration for the directional sensor 15.

In the embodiment of the present disclosure, as illustrated in FIG. 1, the system further comprises a second triaxial Helmholtz coil 2 and a (high-precision) inclination and azimuth test turntable 4;
wherein the industrial control computer 11 is further connected to the second triaxial Helmholtz coil 2, the sensor signal acquisition system 12 is further connected to the inclination and azimuth test turntable 4 placed in the second triaxial Helmholtz coil 2, and the calibrated directional sensor 15 is placed on the inclination and azimuth test turntable 4;
the second triaxial Helmholtz coil 2 is configured to generate an additional magnetic field by adjustment after offsetting the static environmental magnetic field, under the control of the industrial control computer 11, a magnitude of a magnetic induction intensity of the additional magnetic field being equal to that of a geomagnetic induction intensity, and a direction of the magnetic induction intensity being the same as that of a gravity field;
the inclination and azimuth test turntable 4 is configured to adjust an inclination and an azimuth under the additional magnetic field, and generate the second acquisition data of the calibrated directional sensor 15 at different attitudes;
the sensor signal acquisition system 12 is configured to download calibration data to the directional sensor 15 to generate the calibrated directional sensor 15, acquire the second acquisition data, and verify the directional sensor 15 according to the second acquisition data.

In which, three uniform DC magnetic fields from −100 uT to 100 uT are generated on three axes in a space of 50 cm×50 cm×50 cm inside each of the first triaxial Helmholtz coil 1 and the second triaxial Helmholtz coil 2. A loading height and inclination rotation axis of the heating calibration turntable 3 is set in a uniform magnetic field space of the first triaxial Helmholtz coil 1, and a loading height and inclination rotation axis of the inclination and azimuth test turntable 4 is set in a uniform magnetic field space of the second triaxial Helmholtz coil 2. The 50 cm×50 cm×50 cm spatial dimension is larger than a spatial rotation range of directional sensors of different specifications during calibration and verification, which ensures the uniformity of the environmental magnetic field during the calibration and verification of the directional sensor. The magnetic field intensity from −100 uT to 100 uT ensures that the magnetic field generated by each axis is enough to offset the vector magnetic field of the static geomagnetic field in that direction. Under the condition of offsetting the geomagnetic field, a standard magnetic field with an intensity similar to that of the geomagnetic field can be generated in any direction.

A detection precision of the inclination and azimuth test turntable 4 for inclination and azimuth is less than 0.01° and less than 0.05°, respectively, which is higher than the measurement precision of the directional sensor and is convenient for a calibration test.

The second triaxial Helmholtz coil 2 is corrected with the above method.

Figure 15:
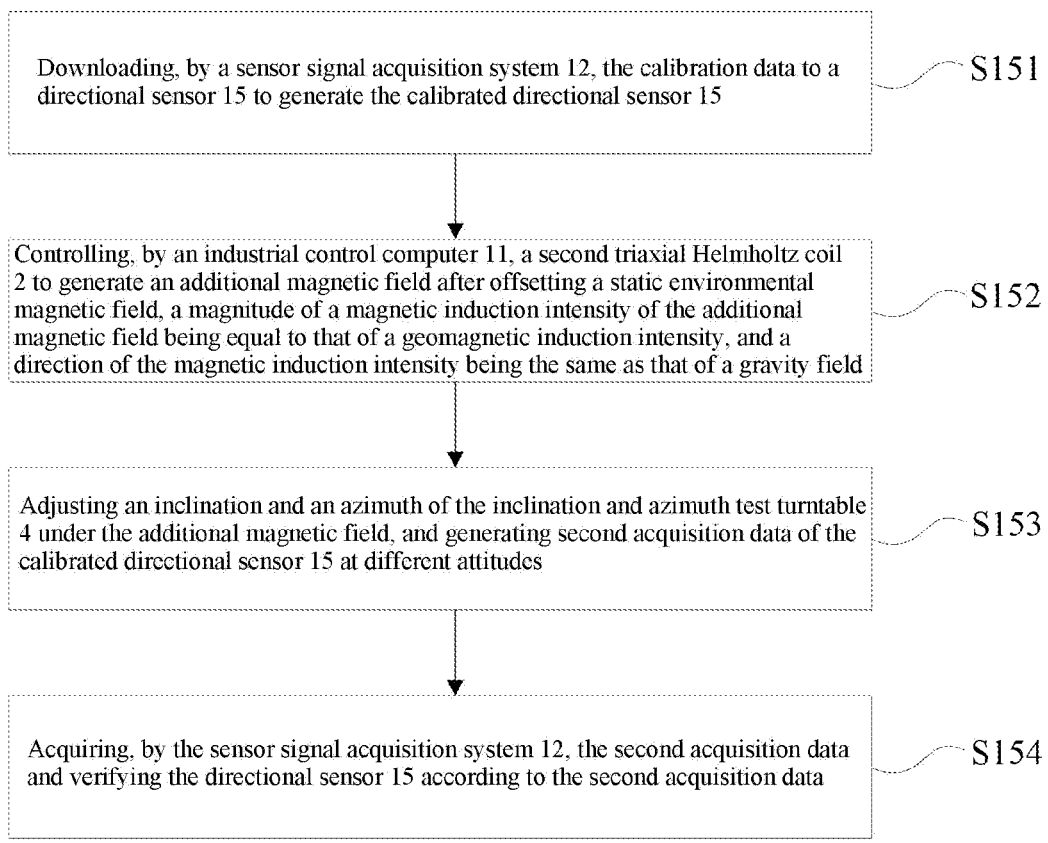
FIG. 15 is a schematic flowchart of a verification method for a directional sensor according to an embodiment of this disclosure.

FIG. 15 is a schematic flowchart of a verification method for a directional sensor according to an embodiment of this disclosure. As illustrated in FIG. 15, the method comprises:

S151: downloading, by a sensor signal acquisition system 12, the calibration data to a directional sensor 15 to generate the calibrated directional sensor 15;

S152: controlling (i.e., adjusting), by an industrial control computer 11, a second triaxial Helmholtz coil 2 to generate an additional magnetic field after offsetting a static environmental magnetic field, a magnitude of a magnetic induction intensity of the additional magnetic field being equal to that of a geomagnetic induction intensity, and a direction of the magnetic induction intensity being the same as that of a gravity field;

S153: adjusting an inclination and an azimuth of the inclination and azimuth test turntable 4 under the additional magnetic field, and generating second acquisition data of the calibrated directional sensor 15 at different attitudes;

S154: acquiring, by the sensor signal acquisition system 12, the second acquisition data and verifying the directional sensor 15 according to the second acquisition data, wherein the calibrated directional sensor 15 is placed on the inclination and azimuth test turntable 4 placed in the second triaxial Helmholtz coil 2.

The specific procedure of verifying the calibrated directional sensor is as follows:

The output value of the corrected sensor is taken to check the tool surface $\theta$, the inclination $\alpha$, the azimuth $\omega$ and other parameters measured by the directional sensor 15 in a certain attitude. For example, regarding measurement values $A_x$, $A_y$ and $A_z$ of three acceleration sensors, formulas (3), (4) and (5) are given as follows:

$$\theta = \tan^{-1} \frac{A_x}{A_y} \quad (3)$$

$$\alpha = \tan^{-1} \frac{\sqrt{A_x^2 + A_y^2}}{A_z^2} \quad (4)$$

$$\omega = \tan^{-1} \frac{\sqrt{A_x^2 + A_y^2 + A_z^2}\,(M_x A_y - M_y A_x)}{M_z(A_x^2 - A_y^2) + A_z(M_x A_x - M_y A_y)} \quad (5)$$

In order to facilitate the simulation of borehole trajectories at different latitudes, a magnetic inclination DIP is adjusted for verification. For example, axes $Z_B$ and $X_B$ of the first triaxial Helmholtz coil 1 are adjusted, as illustrated in formula (6):

$$DIP = \tan^{-1} \frac{X_B}{Z_B} \quad (6)$$

The method for verifying the measurement precision of the directional sensor 15 after calibration is for example as follows:

adjusting the first triaxial Helmholtz coil 1 to have an axis $Z_B$ of 40 µT, an axis $X_B$ of 30 µT, and a magnetic inclination of 36.9°; fixing the inclinations of the heating calibration turntable 3 at 4°, 45° and 90° respectively under different temperature conditions; rotating the tool surface of the heating calibration turntable 3, and recording, from 0°, the inclination, the azimuth, the tool surface and other parameters measured by the directional sensor 15 every 45°; determining the measurement precision of the directional sensor by calculating a difference between the maximum value and the minimum value among the measurement values obtained after the directional sensor 15 rotates for one circle. The measurement precision is: the inclination ≤+0.1° and the azimuth ≤±0.6°.

The specific procedure of verifying the calibrated directional sensor using the calibration method and system for a directional sensor according to the present disclosure is as follows:

fixing the calibrated directional sensor 15 on the high-precision inclination and azimuth test turntable 4, adjusting the magnetic inclination DIP of the second triaxial Helmholtz coil 2 with reference to the above method, rotating the high-precision inclination and azimuth test turntable 4, reading the measurement values of the directional sensor 15, and comparing the measurement values with the nominal values displayed on the high-precision inclination and azimuth test turntable 4 for verifying the calibration result of the directional sensor 15. In which, the nominal values refer to a display result of the inclination and azimuth test turntable 4, for checking whether the result meets a criterion by the comparison with the measurement values of the calibrated directional sensor. The detection precision of the inclination and azimuth test turntable 4 for inclination and azimuth is less than 0.01° and less than 0.05°, respectively, which is higher than the measurement precision of the directional sensor and is convenient for a calibration test.

That is, the level meter 16 is placed on the inclination and azimuth test turntable 4 for calibrating the horizontal attitude of the inclination and azimuth test turntable 4. The triaxial magnetic sensor 17 may also be placed on the inclination and azimuth test turntable 4 for calibrating the calibration coefficient, the zero deviation and the orthogonality of the second triaxial Helmholtz coil 2.

In the embodiment of the present disclosure, as illustrated in FIG. 1, the system may further comprise a second base 6 disposed in the second triaxial Helmholtz coil 2, and the inclination and azimuth test turntable 4 is disposed on the second base 6.

Figure 2:
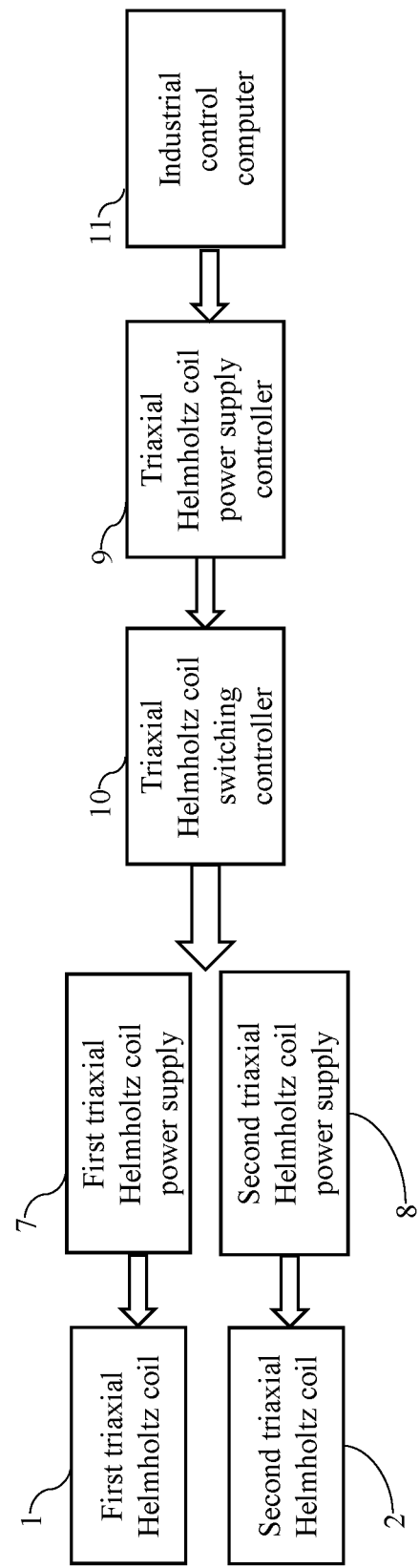
FIG. 2 is a schematic diagram of a control of a triaxial Helmholtz coil according to an embodiment of this disclosure.
Figure 3:
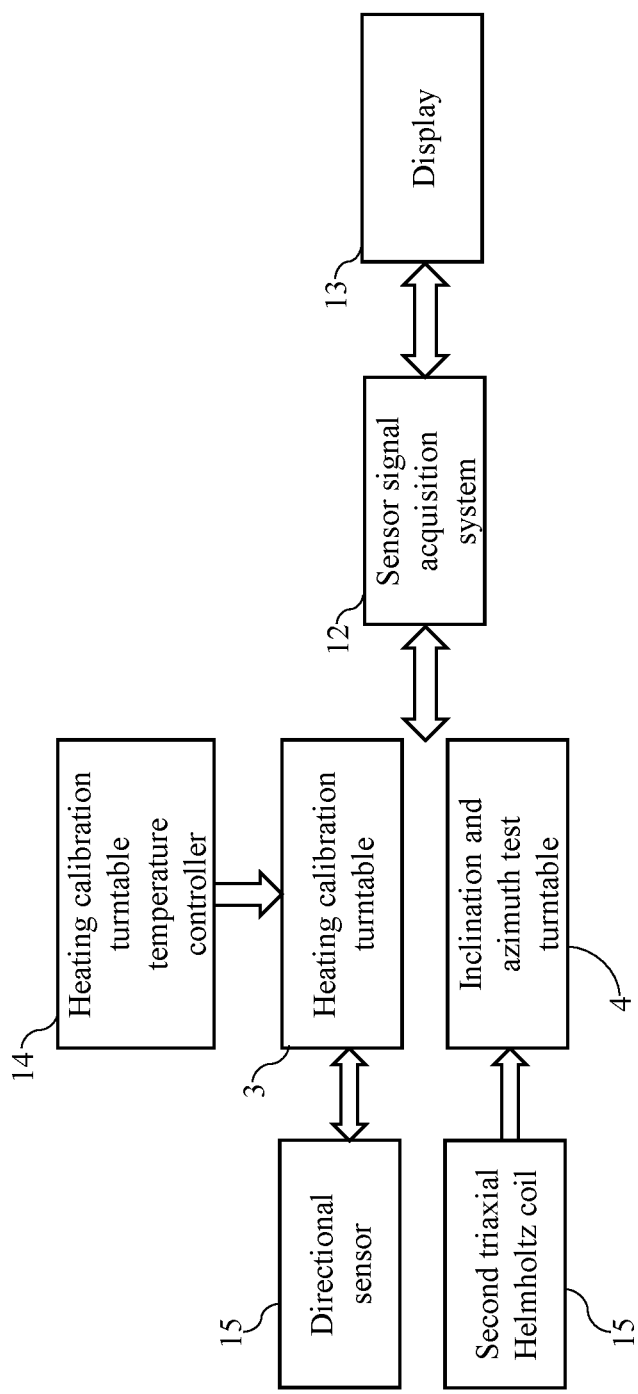
FIG. 3 is a schematic diagram of a data acquisition by a directional sensor according to an embodiment of this disclosure.

In the embodiment of the present disclosure, as illustrated in FIGS. 1, 2 and 3, the system may further comprise a first triaxial Helmholtz coil power supply 7, a second triaxial Helmholtz coil power supply 8, a triaxial Helmholtz coil power supply controller 9 and a triaxial Helmholtz coil switching controller 10;

wherein the industrial control computer 11, the triaxial Helmholtz coil power supply controller 9 and the triaxial Helmholtz coil switching controller 10 are connected in sequence; the triaxial Helmholtz coil switching controller 10 is connected to the first triaxial Helmholtz coil power supply 7 and the second triaxial Helmholtz coil power supply 8, respectively; the first triaxial Helmholtz coil power supply 7 is connected to the first triaxial Helmholtz coil 1, and the second triaxial Helmholtz coil power supply 8 is connected to the second triaxial Helmholtz coil 2;

the industrial control computer 11 is further configured to control the triaxial Helmholtz coil switching controller 10 by the triaxial Helmholtz coil power supply controller 9, to switch the first triaxial Helmholtz coil power supply 7 or the second triaxial Helmholtz coil power supply 8 to work, and then control the first triaxial Helmholtz coil 1 or the second triaxial Helmholtz coil 2; and operate the triaxial Helmholtz coil switching controller 10 to turn off the first triaxial Helmholtz coil power supply 7 and switch to the second triaxial Helmholtz coil power supply 8 for a control, or turn off the second triaxial Helmholtz coil power supply 8 and switch to the first triaxial Helmholtz coil power supply 7 for a control.

In the embodiment of the present disclosure, as illustrated in FIG. 1, the system may further comprise a display 13 connected to the sensor signal acquisition system 12 for displaying the first acquisition data and/or second acquisition data acquired by the sensor signal acquisition system 12.

In which, the first triaxial Helmholtz coil power supply 7, the second triaxial Helmholtz coil power supply 8, the triaxial Helmholtz coil power supply controller 9, the triaxial Helmholtz coil switching controller 10 and the industrial control computer 11 are placed in one cabinet.

In which, two groups of triaxial Helmholtz coil systems are controlled by the triaxial Helmholtz coil switching controller 10 to avoid any mutual magnetic field interference therebetween, thereby reducing a distance between two groups of coils (at least 1 meter), the occupied area of the system and the maintenance cost of the system.

An embodiment of the present disclosure further provides a computer device, comprising a memory, a processor and a computer program stored in the memory and executable on the processor, wherein the processor implements the calibration and verification method for a directional sensor when executing the computer program.

An embodiment of the present disclosure further provides a computer readable storage medium, which stores a computer program for executing the calibration and verification method for a directional sensor.

To sum up, according to the calibration and verification method and system for a directional sensor proposed by the present disclosure, by adjusting the size and the direction of the spatial magnetic field in the triaxial Helmholtz coil system, the magnetic field and gravity field are in the same direction, which can provide a traceable standard magnetic field environment for the magnetic sensor of the directional sensor for petroleum engineering logging and drilling, and solve the problem that the environmental magnetic field and the earth gravity field are in different directions; by swinging the spatial attitude of the heating calibration turntable, the acquisition data of the magnetic sensor and the acceleration sensor of the directional sensor can be simultaneously obtained at the same position, and the calibration values can be obtained by data processing with the total field calibration method, so as to calibrate the directional sensor under different temperature conditions, ensure the measurement accuracy of the directional sensor under different temperature conditions, and solve the problem that the data of the magnetic sensor and the acceleration sensor needs to be acquired repeatedly in the calibration procedure, thereby simplifying the calibration procedure and improving the calibration efficiency for the directional sensor; through the verification by the inclination and azimuth test turntable, engineering measurement values after the calibration for the directional sensor, such as the well deviation, the azimuth, the tool surface, etc., can be verified, and a conclusion can be made on the calibration precision of the directional sensor to ultimately achieve the purpose of improving the measurement precision of the borehole trajectory, which can provide calibration data to the directional sensor for petroleum engineering logging and drilling at any magnetic inclination and temperature. Further, the calibration accuracy of the directional sensor is improved by tracing the magnetic field of the triaxial Helmholtz coil and adjusting the direction of the magnetic field. In petroleum engineering, by improving the calibration and verification precision of the downhole directional sensor, the uncertainty of the borehole trajectory can be reduced and the targeting rate of the drilling construction can be improved.

Those skilled in the art should understand that any embodiment of the present disclosure can be provided as a method, a system or a computer program product. Therefore, the present disclosure may take the form of an entire hardware embodiment, an entire software embodiment, or an embodiment combining both software and hardware. Moreover, the present disclosure may take the form of computer program products implemented on one or more computer usable storage mediums (including, but not limited to, a magnetic disc memory, CD-ROM, optical storage, etc.) containing therein computer usable program codes.

The present disclosure is described with reference to the flowcharts and/or block diagrams of the methods, devices (systems) and computer program products according to the embodiments of the present disclosure. It should be understood that each process and/or block in the flowcharts and/or block diagrams, and the combination of the processes and/or blocks in the flowcharts and/or block diagrams can be implemented by computer program instructions. The computer program instructions can be provided to a general computer, a dedicated computer, an embedded processor or a processor of other programmable data processing device, to form a machine so that the instructions, which are executed by the computer or the processor of other programmable data processing device, generate means for realizing the functions specified in one or more processes in the flowcharts and one or more blocks in the block diagrams.

The computer program instructions may also be stored in a computer readable memory which is capable of guiding the computer or other programmable data processing device to work in a specific mode, so that the instructions stored in the computer readable memory generate a product including instructing means for realizing the functions specified in one or more flows in the flowchart and one or more blocks in the block diagram.

These computer program instructions may also be stored in a computer-readable memory that can direct a computer or other programmable data processing device to operate in a specific manner, so that the instructions stored in the computer-readable memory achieve an article of manufacture including the instruction device, with the instruction device implementing the functions specified in one or more processes in the flowcharts and/or one or more blocks in the block diagrams.

The above specific embodiments further explain the objectives, technical solutions and advantageous effects of the present disclosure in detail. It should be understood that those described above are only specific embodiments of the present disclosure and are not intended to limit the protection scope of the present disclosure. Any modification, equivalent substitution or improvement made within the spirit and principle of the present disclosure should fall within the protection scope of the present disclosure.

What is claimed is:

1. A calibration and verification system for a directional sensor, comprising: an industrial control computer and the directional sensor;
    wherein the industrial control computer is connected to a sensor signal acquisition system, a first triaxial Helmholtz coil and a second triaxial Helmholtz coil, respectively;
    wherein a heating calibration turntable is disposed in the first triaxial Helmholtz coil;
    wherein the directional sensor is disposed on the heating calibration turntable to be heated and calibrated by the heating calibration turntable;
    wherein the sensor signal acquisition system is connected to the heating calibration turntable to acquire a data of the directional sensor under a control of the industrial control computer;
    wherein a high-precision inclination and azimuth test turntable is disposed in the second triaxial Helmholtz coil and configured to verify the directional sensor; and
    wherein a first base is disposed in the first triaxial Helmholtz coil, and the heating calibration turntable is disposed on the first base and connected to the industrial control computer via a heating calibration turntable temperature controller.

2. The calibration and verification system for the directional sensor according to claim 1, wherein three uniform DC magnetic fields from −100 uT to 100 uT can be generated on three axes in a space of 50 cm×50 cm×50 cm inside the first triaxial Helmholtz coil; and
    wherein a loading height and an inclination rotation axis of the heating calibration turntable is set in a uniform magnetic field space of the first triaxial Helmholtz coil.

3. The calibration and verification system for the directional sensor according to claim 1, wherein a second base is disposed in the second triaxial Helmholtz coil; and
    wherein the high-precision inclination and azimuth test turntable is disposed on the second base and is connected to the industrial control computer.

4. The calibration and verification system for the directional sensor according to claim 3, wherein three uniform DC magnetic fields from −100 uT to 100 uT can be generated on three axes in a space of 50 cm×50 cm×50 cm inside the second triaxial Helmholtz coil; and
    wherein a loading height and an inclination rotation axis of the high-precision inclination and azimuth test turntable is set in a uniform magnetic field space of the second triaxial Helmholtz coil.

5. The calibration and verification system for the directional sensor according to claim 3, wherein a detection precision of the high-precision inclination and azimuth test turntable for inclination and azimuth is less than 0.01° and less than 0.05°, respectively.

6. The calibration and verification system for the directional sensor according to claim 1, wherein the industrial control computer is connected to a triaxial Helmholtz coil switching controller via a triaxial Helmholtz coil power supply controller; and
    wherein the triaxial Helmholtz coil switching controller is connected to a first triaxial Helmholtz coil power supply and a second triaxial Helmholtz coil power supply, respectively;
    wherein the first triaxial Helmholtz coil power supply is connected to the first triaxial Helmholtz coil; and
    wherein the second triaxial Helmholtz coil power supply is connected to the second triaxial Helmholtz coil.

7. The calibration and verification system for the directional sensor according to claim 1, wherein a shortest distance between the first triaxial Helmholtz coil and the second triaxial Helmholtz coil is 1 meter.

8. A method for calibrating and verifying a directional sensor with a calibration and verification system, the method comprising:
    1) Calibrating a horizontal attitude of a heating calibration turntable using a level meter; wherein the heating calibration turntable is disposed in a first triaxial Helmholtz coil, wherein the first triaxial Helmholtz coil is connected to an industrial control computer which is also connected to a sensor signal acquisition system and a second triaxial Helmholtz coil, wherein a first base is disposed in the first triaxial Helmholtz coil, and the heating calibration turntable is disposed on the first base and connected to the industrial control computer via a heating calibration turntable temperature controller, wherein the sensor signal acquisition system is connected to the heating calibration turntable to acquire a data of the directional sensor under a control of the industrial control computer, and wherein a high-precision inclination and azimuth test turntable is disposed on the second triaxial Helmholtz coil and configured to verify the directional sensor;
    2) placing a triaxial magnetic sensor on the heating calibration turntable, placing the first triaxial Helmholtz coil on a periphery of the heating calibration turntable, and calibrating a calibration coefficient, a zero deviation and an orthogonality of the first triaxial Helmholtz coil using the triaxial magnetic sensor;
    3) placing the directional sensor on the heating calibration turntable such that the directional sensor is configured to be heated and calibrated by the heating calibration turntable; adjusting the first triaxial Helmholtz coil to generate an additional magnetic field after offsetting a static environmental magnetic field, a magnitude of a magnetic induction intensity of the additional magnetic field being equal to that of a geomagnetic induction intensity, and a direction of the magnetic induction intensity being the same as that of a gravity field; adjusting a temperature and triaxial angles of the heating calibration turntable to obtain acquisition data of the directional sensor at different attitudes; and calibrating the directional sensor with a data processing method of total field calibration.

9. The method according to claim 8, wherein while the directional sensor is calibrated with the method of total field calibration in step 3), a magnetic sensor and an acceleration sensor are calibrated.

10. The method according to claim 8, wherein calibrating the directional sensor with the method of total field calibration in step 3) comprises:
   a) adjusting the first triaxial Helmholtz coil so that an output magnetic field meets a calibration requirement of a total field value, and acquiring and incorporating the acquisition data of the directional sensor into a corresponding calibration model;
   b) running the calibration model using a calibration program, and solving a calibration factor, a zero deviation and an orthogonal deviation of the directional sensor; and
   c) calibrating the directional sensor according to the calibration factor, the zero deviation and the orthogonal deviation.

11. The method according to claim 8, wherein calibrating the calibration coefficient and the zero deviation of the first triaxial Helmholtz coil using the triaxial magnetic sensor in step 2) comprises:
   a) adjusting the first triaxial Helmholtz coil to generate two vector magnetic fields with a same magnitude and opposite directions on each of axes $X_B$, $Y_B$ and $Z_B$ after offsetting the static environmental magnetic field;
   b) adjusting the calibration coefficient of the first triaxial Helmholtz coil until set values of the first triaxial Helmholtz coil are equal to measurement values of the triaxial magnetic sensor, the measurement values of the triaxial magnetic sensor being $X_{B1}$, $Y_{B1}$, $Z_{B1}$ and $X_{B2}$, $Y_{B2}$, $Z_{B2}$; and
   c) adjusting the zero deviation of the first triaxial Helmholtz coil so that $X_{Bmin}$, $Y_{Bmin}$ and $Z_{Bmin}$ are minimum values, wherein $X_{Bmin}=X_{B1}+X_{B2}$, $Y_{Bmin}=Y_{B1}+Y_{B2}$ and $Z_{Bmin}=Z_{B1}+Z_{B2}$.

12. The method according to claim 11, wherein calibrating the orthogonality of the first triaxial Helmholtz coil using the triaxial magnetic sensor in step 2) comprises:
   a) adjusting the first triaxial Helmholtz coil to generate a vector magnetic field along each of axes $X_B$, $Y_B$ and $Z_B$ after offsetting the static environmental magnetic field, the corresponding measurement values of the triaxial magnetic sensor are $X_{B3}$, $Y_{B3}$ and $Z_{B3}$, respectively; and
   b) rotating three axes of the heating calibration turntable along the direction of the vector magnetic fields to adjust the orthogonality of the first triaxial Helmholtz coil by observing the measurement values of the triaxial magnetic sensor, until the vector magnetic field $X_B$ generated by the first triaxial Helmholtz coil is parallel to the measurement value $X_{B3}$, the vector magnetic field $Y_B$ is parallel to the measurement value $Y_{B3}$, and an axis $Z_B$ is parallel to the measurement value $Z_{B3}$.

13. The method according to claim 8, wherein the triaxial magnetic sensor is subjected to a standard magnetic tracing treatment.

14. A computer device, comprising: a memory, a processor, and a computer program stored in the memory and executable on the processor; wherein the processor implements the method according to claim 8 when executing the computer program.

15. A computer readable storage medium, which stores a computer program for performing the method according to claim 8.

* * * * *